(12) United States Patent
Embleton et al.

(10) Patent No.: US 10,917,996 B1
(45) Date of Patent: Feb. 9, 2021

(54) SYSTEM AND METHOD FOR DEVICE LEVEL THERMAL MANAGEMENT AND ELECTROMAGNETIC INTERFERENCE MANAGEMENT

(71) Applicant: Dell Products L.P., Hopkinton, MA (US)

(72) Inventors: Steven Embleton, Austin, TX (US); Ben John Sy, Austin, TX (US); Eric Michael Tunks, Austin, TX (US)

(73) Assignee: Dell Products L.P., Hopkinton, MA (US)

( * ) Notice: Subject to any disclaimer, the term of this patent is extended or adjusted under 35 U.S.C. 154(b) by 0 days.

(21) Appl. No.: 16/516,312

(22) Filed: Jul. 19, 2019

(51) Int. Cl.
| | |
|---|---|
| *H05K 7/20* | (2006.01) |
| *H05K 9/00* | (2006.01) |
| *H05K 7/14* | (2006.01) |
| *H04W 76/10* | (2018.01) |

(52) U.S. Cl.
CPC ....... *H05K 7/20709* (2013.01); *H05K 7/1488* (2013.01); *H05K 9/0062* (2013.01); *H04W 76/10* (2018.02); *H05K 7/20781* (2013.01)

(58) Field of Classification Search
CPC ............ H05K 7/2039; H05K 7/20545; H05K 7/20709; H05K 7/20854; H05K 7/209; H05K 9/0024; H05K 9/0037; H05K 9/0043
See application file for complete search history.

(56) References Cited

U.S. PATENT DOCUMENTS

| | | |
|---|---|---|
| 4,785,136 A | 11/1988 | Mollet et al. |
| 4,858,309 A | 8/1989 | Korsunsky et al. |
| 4,871,220 A | 10/1989 | Kohin |
| 5,049,701 A | 9/1991 | Vowles et al. |
| 5,250,752 A | 10/1993 | Cutright |
| 5,294,748 A | 3/1994 | Schwenk et al. |
| 5,323,298 A | 6/1994 | Shatas et al. |
| 5,437,560 A | 8/1995 | Mizuguchi |
| 5,545,844 A | 8/1996 | Plummer, III et al. |
| 5,649,831 A | 7/1997 | Townsend |
| 5,762,513 A | 6/1998 | Stine |
| 5,812,370 A | 9/1998 | Moore et al. |
| 5,943,218 A | 8/1999 | Liu |
| 6,038,130 A | 3/2000 | Boeck et al. |
| 6,045,385 A | 4/2000 | Kane |
| 6,068,009 A | 5/2000 | Paes et al. |
| 6,176,727 B1 | 1/2001 | Liu et al. |

(Continued)

OTHER PUBLICATIONS

"Full HD Endoscopes"; joimax® GmbH, May 1, 2019; https://web.archive.org/web/20190501003355/https://www.ioimax.com/en/products/electronic-devices/hd_endoscopes/.

(Continued)

*Primary Examiner* — Jacob R Crum
(74) *Attorney, Agent, or Firm* — Chamberlain, Hrdlicka, White, Williams & Aughtry

(57) ABSTRACT

A data processing device includes an internal volume divided into isolated portions and a thermal management portion. The data processing device further includes an isolator that electromagnetically isolates a first isolated portion of the isolated portions from a second isolated portion of the isolated portions. The data processing device also include a thermal bus, disposed in the thermal management portion, that thermally manages the first portion.

20 Claims, 11 Drawing Sheets

(56) References Cited

U.S. PATENT DOCUMENTS

| | | |
|---|---|---|
| 6,208,514 B1 | 3/2001 | Stark et al. |
| 6,225,554 B1 | 5/2001 | Trehan et al. |
| 6,242,690 B1 | 6/2001 | Glover |
| 6,269,001 B1 | 7/2001 | Matteson et al. |
| 6,331,940 B1 | 12/2001 | Lin |
| 6,332,792 B1 | 12/2001 | Lin et al. |
| 6,370,036 B1 | 4/2002 | Boe |
| 6,377,451 B1 | 4/2002 | Furuya |
| 6,437,987 B1 | 8/2002 | Lin |
| 6,517,369 B1 | 2/2003 | Butterbaugh et al. |
| 6,613,977 B1 | 9/2003 | Fowler |
| 6,695,630 B1 | 2/2004 | Ku |
| 6,947,290 B2 | 9/2005 | Hirata |
| 7,035,087 B2 | 4/2006 | Tan |
| 7,075,796 B1 | 7/2006 | Pritchett |
| 7,133,296 B2 | 11/2006 | Choi et al. |
| 7,287,996 B1 | 10/2007 | Shing |
| 7,371,097 B1 | 5/2008 | Pennypacker et al. |
| 7,371,977 B1 | 5/2008 | Preonas |
| 7,692,934 B2 | 4/2010 | Bartscher et al. |
| 7,695,313 B2 | 4/2010 | Karim et al. |
| 7,757,847 B2 | 7/2010 | Tang et al. |
| 8,059,414 B2 | 11/2011 | Wei |
| 8,098,492 B2 | 1/2012 | Rosenberg et al. |
| 8,310,834 B2 | 11/2012 | Fürholzer |
| 8,530,756 B1 | 9/2013 | Winch |
| 8,636,526 B2 | 1/2014 | Funamura et al. |
| 8,642,900 B2 | 2/2014 | Nordling et al. |
| 8,662,295 B2 | 3/2014 | Kubota et al. |
| 8,687,374 B2 | 4/2014 | Watanabe et al. |
| 8,720,682 B2 | 5/2014 | Navon et al. |
| 8,760,859 B2 | 6/2014 | Fuchs et al. |
| 8,969,738 B2 | 3/2015 | Ross |
| 9,019,711 B2 | 4/2015 | Tamura |
| 9,095,045 B2 | 7/2015 | Rojo et al. |
| 9,370,132 B2 | 6/2016 | Coppola |
| 9,497,894 B1 | 11/2016 | Ramsey |
| 9,585,270 B2 | 2/2017 | Yang et al. |
| 9,607,660 B2 | 3/2017 | Bennett, II et al. |
| 9,640,910 B1 | 5/2017 | Chien et al. |
| 9,642,290 B2 | 5/2017 | Anderson et al. |
| 9,820,404 B1 | 11/2017 | Wu et al. |
| 9,829,939 B1 | 11/2017 | Lien et al. |
| 9,930,816 B2 | 3/2018 | Winch et al. |
| 10,249,984 B2 | 4/2019 | Rask |
| 10,364,031 B2 | 7/2019 | Goupil |
| 10,420,258 B1 | 9/2019 | Rahilly et al. |
| 10,477,740 B2 | 11/2019 | Coppola |
| 10,477,741 B1 | 11/2019 | Bae et al. |
| 10,492,324 B2 | 11/2019 | Miura |
| 10,520,532 B2 | 12/2019 | Lee |
| 10,541,519 B1 | 1/2020 | Wavering |
| 10,542,642 B2 | 1/2020 | Babhadiashar et al. |
| 10,575,443 B2 | 2/2020 | Woodbury, II et al. |
| 10,707,636 B2 | 7/2020 | Yamamoto |
| 10,720,722 B2 | 7/2020 | Tsomg et al. |
| 10,734,763 B2 | 8/2020 | M R et al. |
| 2002/0000645 A1 | 1/2002 | Sato et al. |
| 2002/0001181 A1 | 1/2002 | Kondo |
| 2002/0027769 A1 | 3/2002 | Kasahara et al. |
| 2002/0064035 A1 | 5/2002 | Mair et al. |
| 2003/0137811 A1 | 7/2003 | Ling et al. |
| 2003/0174474 A1 | 9/2003 | Mair et al. |
| 2006/0025010 A1 | 2/2006 | Spitaels et al. |
| 2007/0105445 A1* | 5/2007 | Manto ............ H05K 9/0069 439/620.09 |
| 2008/0076291 A1 | 3/2008 | Ewing et al. |
| 2010/0208433 A1 | 8/2010 | Heimann et al. |
| 2010/0285636 A1* | 11/2010 | Chen ............ H01L 25/165 438/113 |
| 2010/0319981 A1* | 12/2010 | Kapusta ............ H05K 9/0043 174/350 |
| 2011/0232956 A1 | 9/2011 | Ramsey |
| 2012/0011700 A1 | 1/2012 | Kelaher et al. |
| 2012/0044653 A1* | 2/2012 | Morris ............ H05K 9/0024 361/728 |
| 2012/0178364 A1 | 7/2012 | Dobyns |
| 2012/0285738 A1 | 11/2012 | Cochrane et al. |
| 2013/0160563 A1 | 6/2013 | Dingier et al. |
| 2013/0194772 A1 | 8/2013 | Rojo et al. |
| 2013/0277520 A1 | 10/2013 | Funk et al. |
| 2014/0138388 A1 | 5/2014 | Synnestvedt |
| 2014/0368821 A1 | 12/2014 | Gazaway et al. |
| 2015/0014912 A1 | 1/2015 | Ivey et al. |
| 2015/0245529 A1 | 8/2015 | Tam et al. |
| 2015/0271959 A1* | 9/2015 | Chen ............ H05K 3/284 361/760 |
| 2015/0368423 A1 | 12/2015 | Yamauchi et al. |
| 2015/0373869 A1 | 12/2015 | Macerini et al. |
| 2016/0111814 A1 | 4/2016 | Hirano et al. |
| 2016/0159480 A1 | 6/2016 | Barth |
| 2016/0182130 A1 | 6/2016 | Ahmed et al. |
| 2016/0372948 A1 | 12/2016 | Kvols |
| 2016/0381818 A1 | 12/2016 | Mills et al. |
| 2018/0062287 A1 | 3/2018 | Shaw et al. |
| 2018/0257334 A1 | 9/2018 | Motoyanagi et al. |
| 2019/0056439 A1 | 2/2019 | Lee |
| 2019/0159371 A1* | 5/2019 | Grinsteinner ........ H05K 9/0083 |
| 2019/0304922 A1* | 10/2019 | Maruthamuthu ..... H01L 23/552 |
| 2019/0353356 A1 | 11/2019 | Fischer |
| 2020/0187578 A1 | 6/2020 | Sadato |

OTHER PUBLICATIONS

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

* cited by examiner

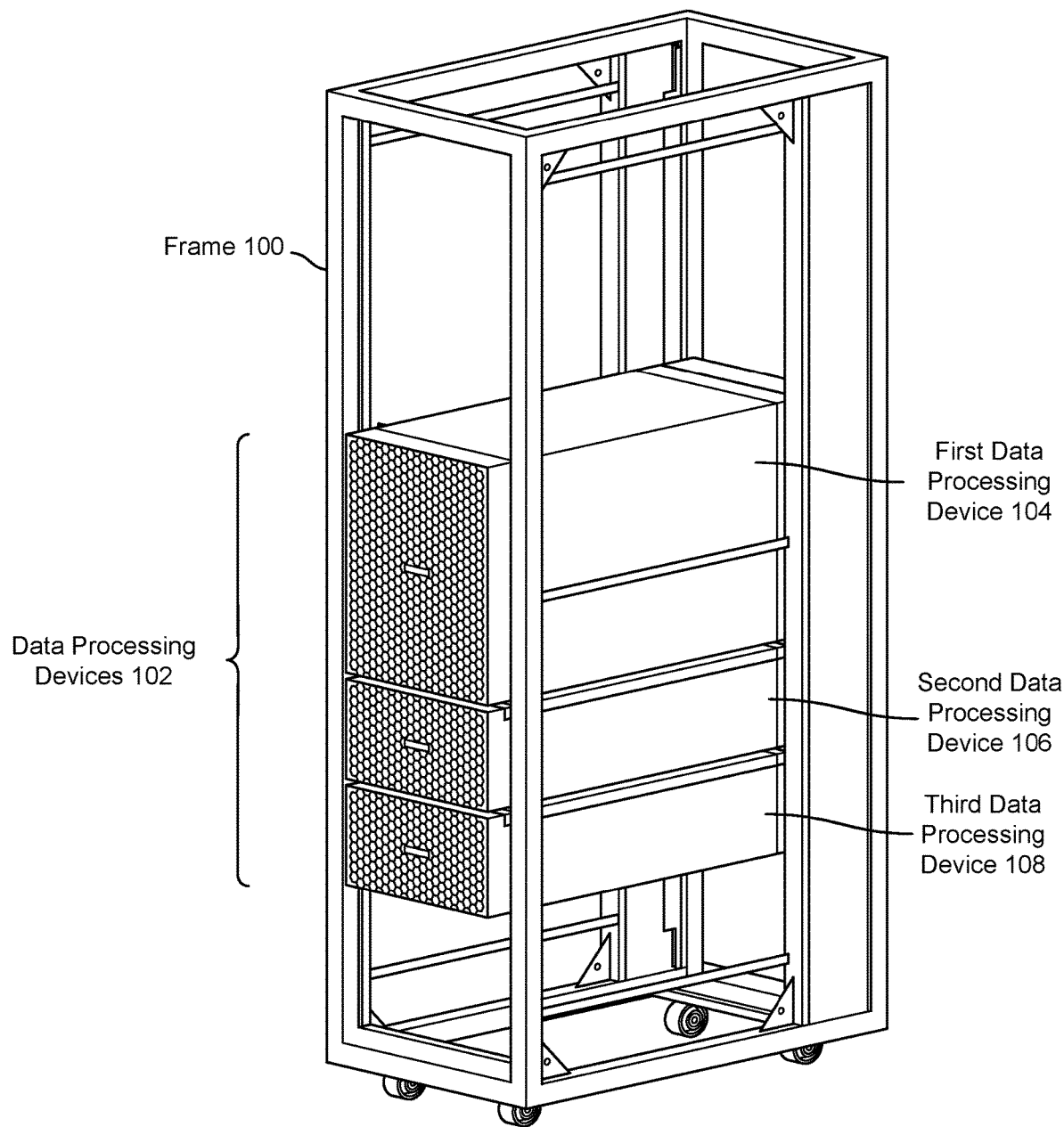
FIG. 1.1

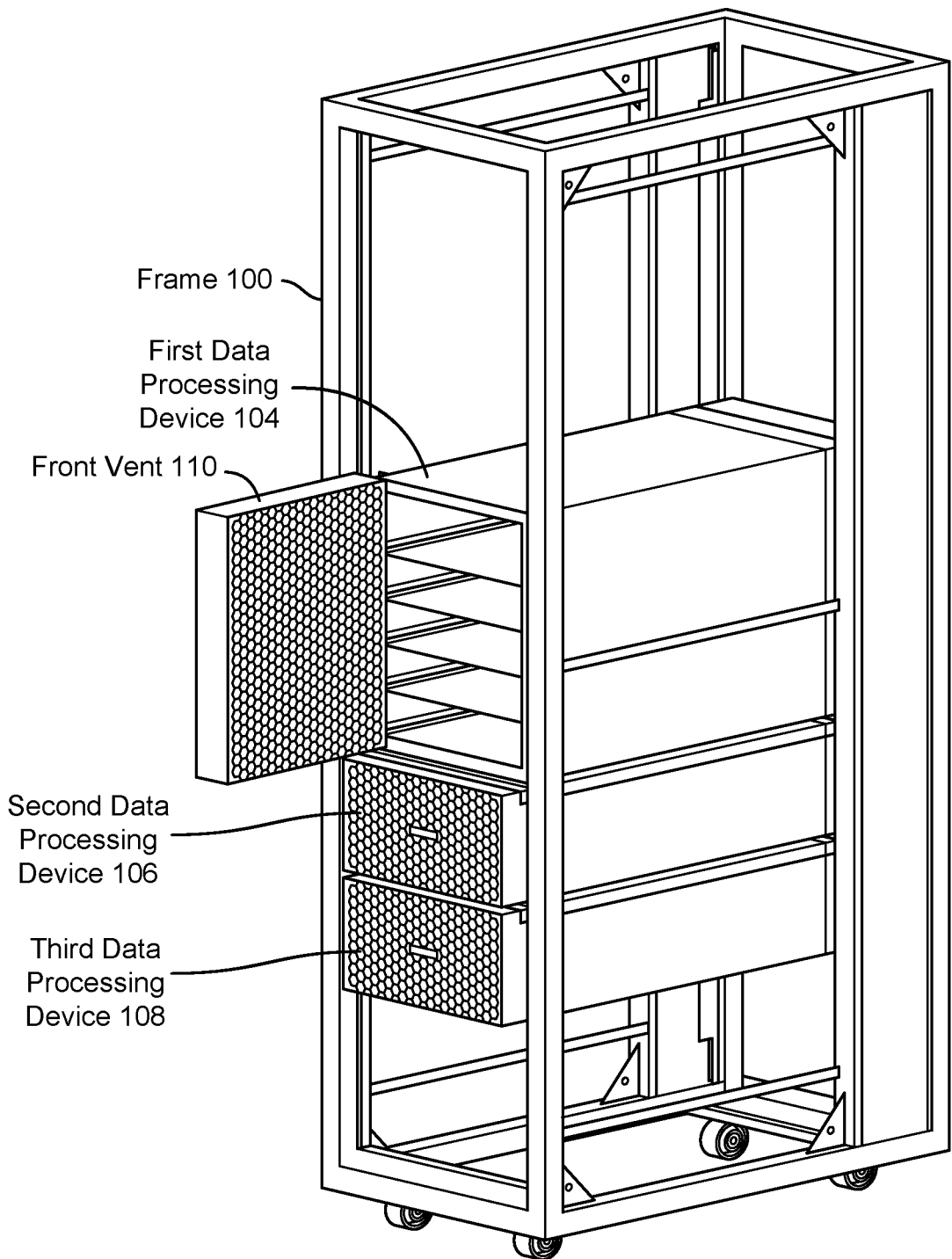
FIG. 1.2

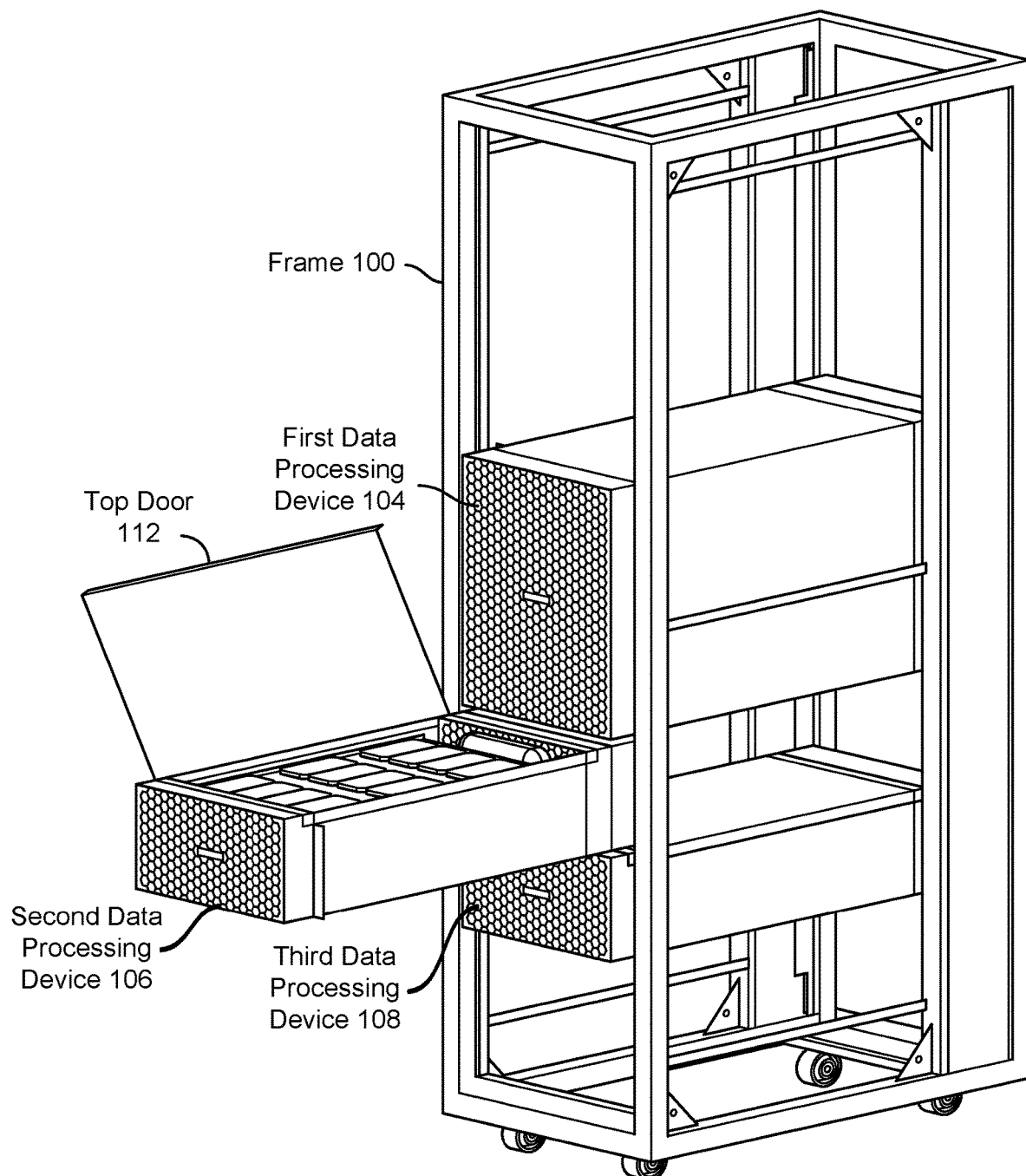
FIG. 1.3

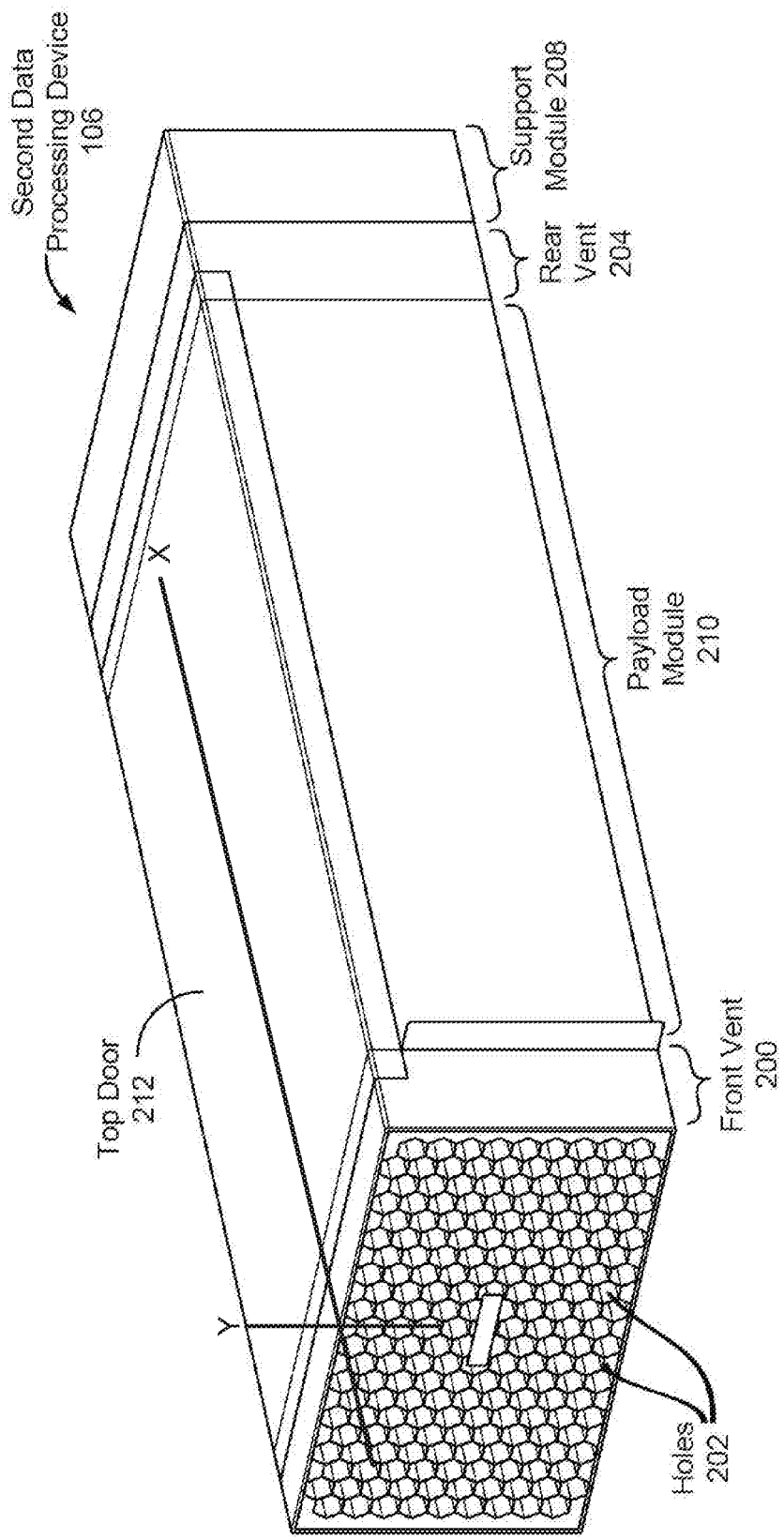
FIG. 2.1

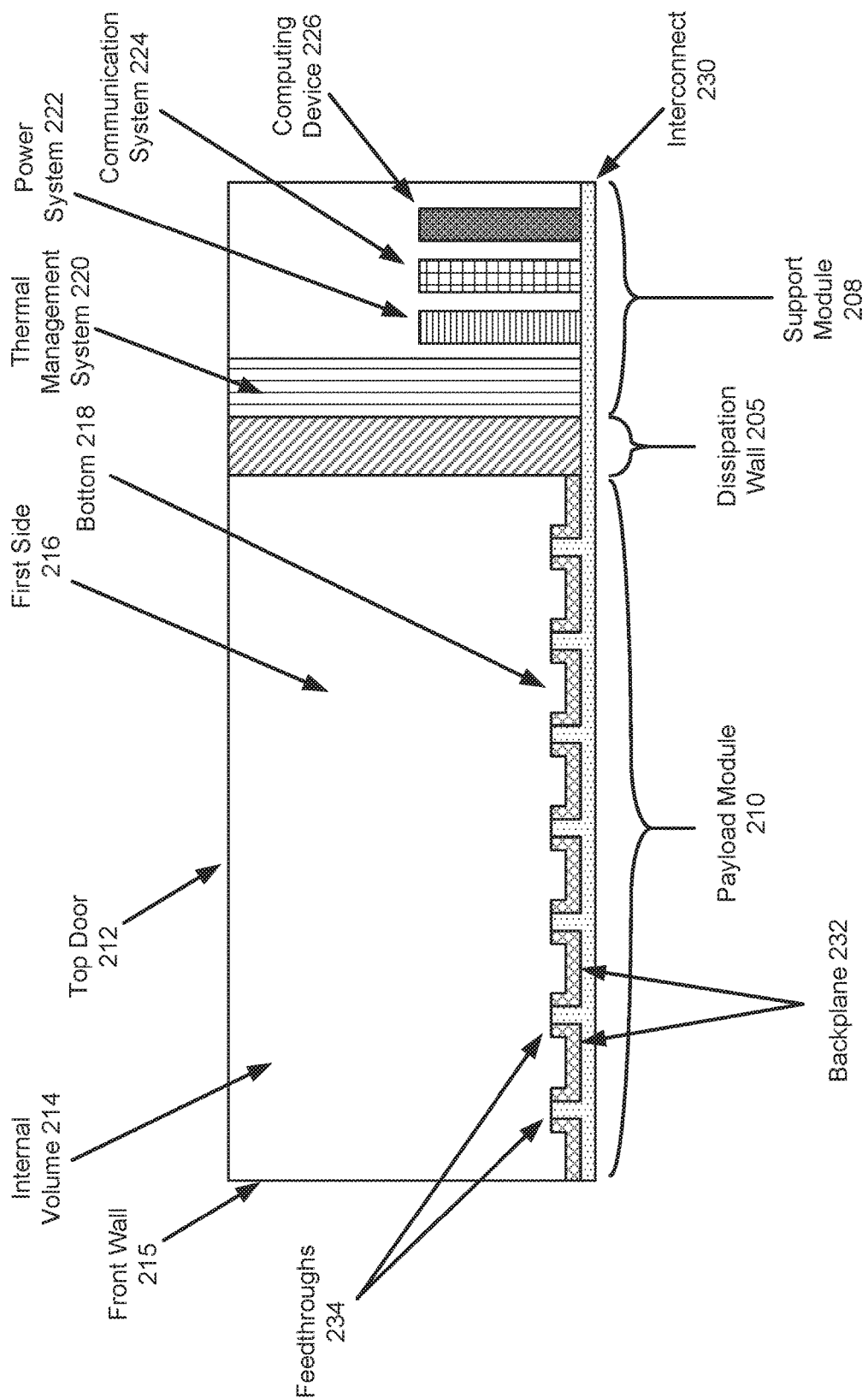
FIG. 2.2

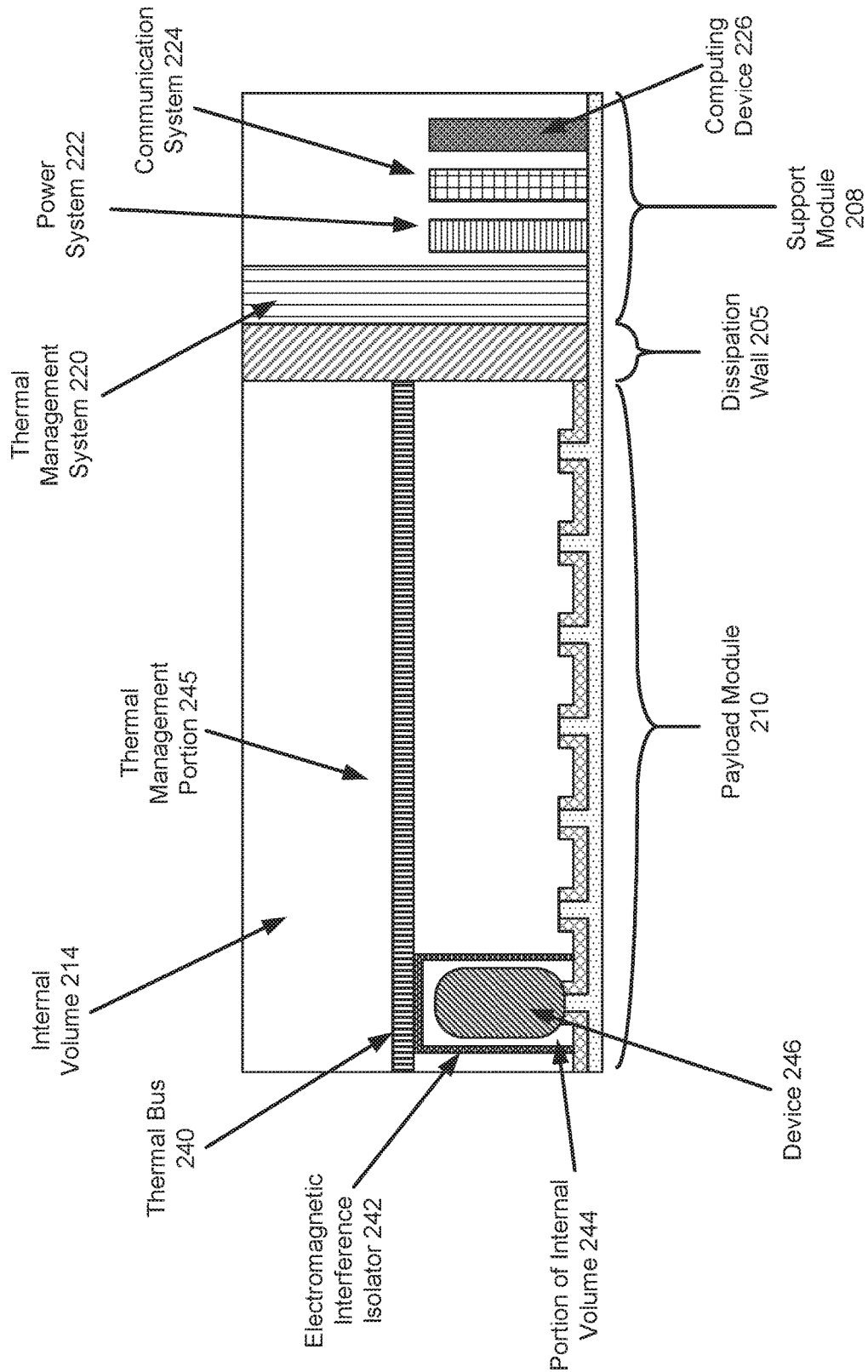
FIG. 2.3

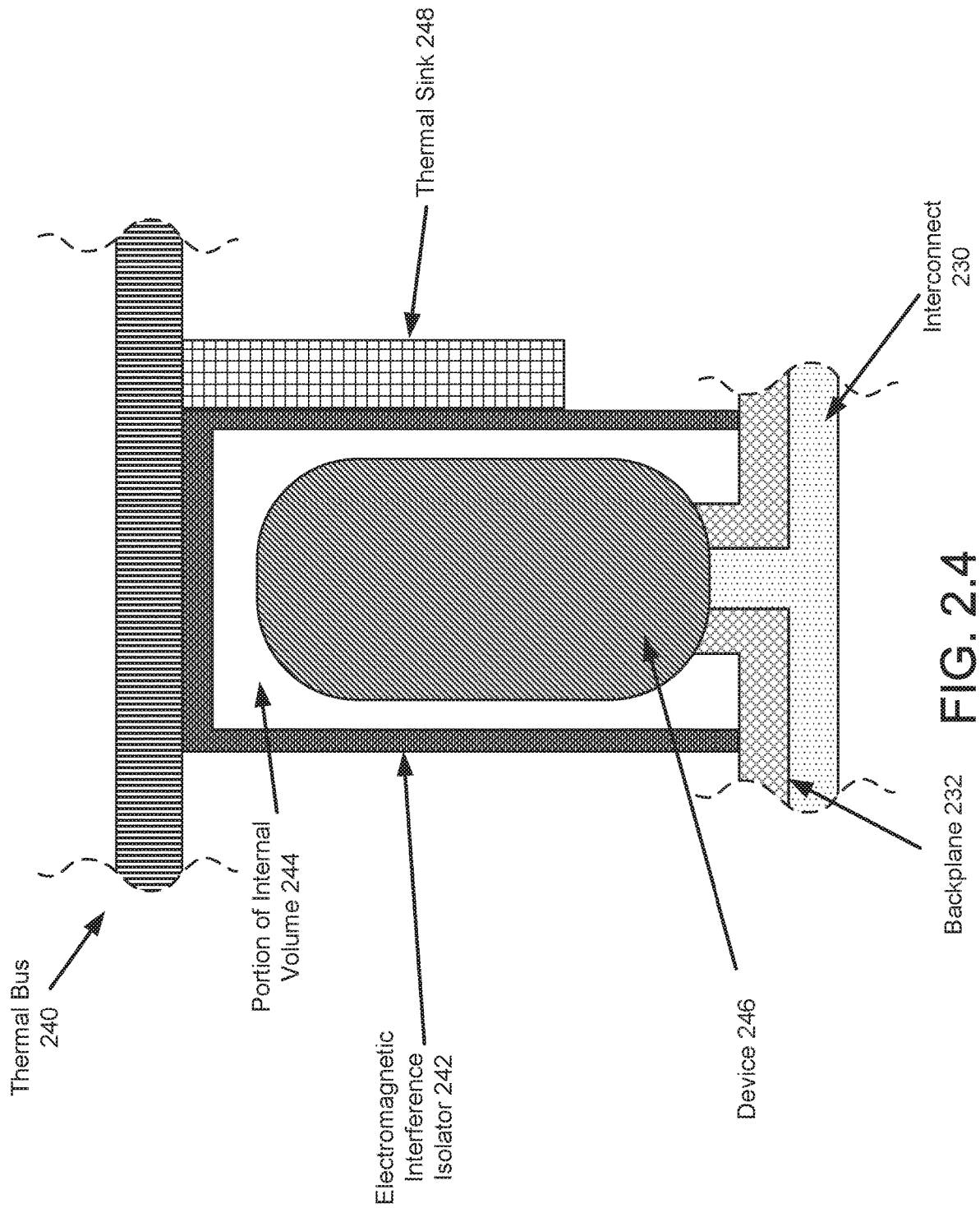

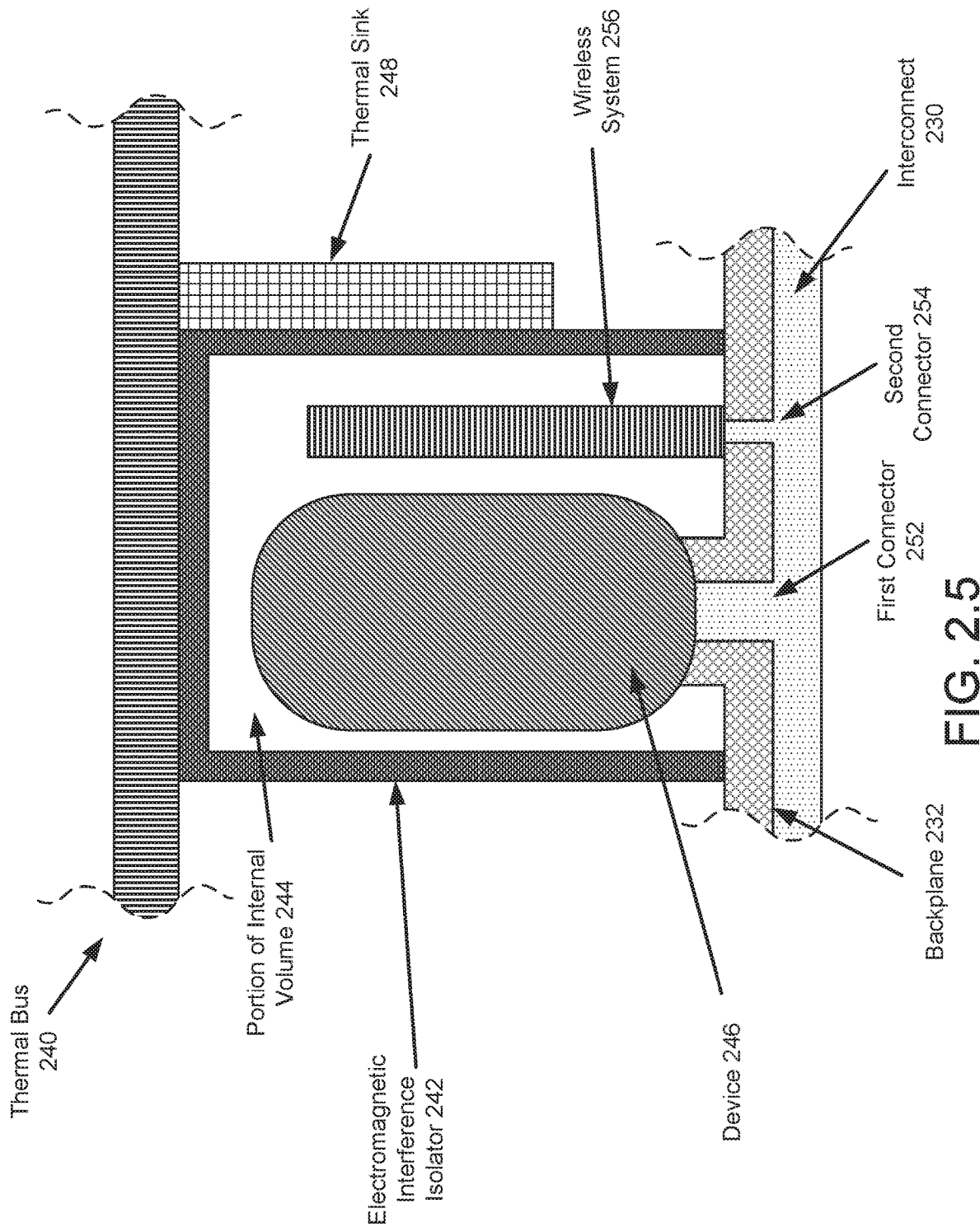
FIG. 2.5

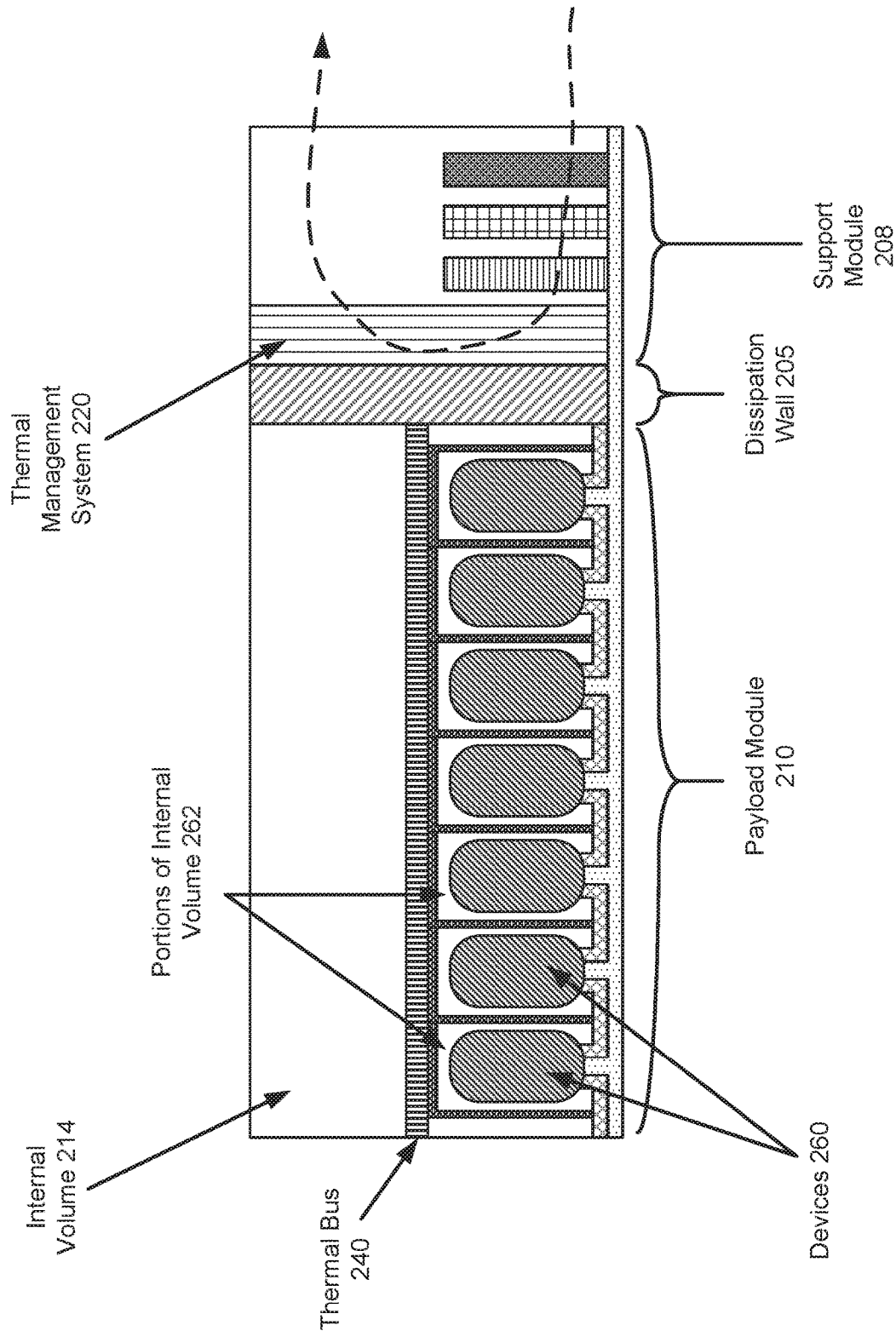
FIG. 2.6

SYSTEM AND METHOD FOR DEVICE LEVEL THERMAL MANAGEMENT AND ELECTROMAGNETIC INTERFERENCE MANAGEMENT

BACKGROUND

High density environment may include devices that are tightly packed together. In other words, the devices may be physically close to each other. Such an environment present numerous challenges relating to thermal management, mechanical positioning and orienting of devices, and electrical concerns related to power and operation of such devices.

SUMMARY

In one aspect, a data processing device in accordance with one or more embodiments of the invention includes an internal volume divided into isolated portions and a thermal management portion; an isolator that electromagnetically isolates a first isolated portion of the isolated portions from a second isolated portion of the isolated portions; and a thermal bus, disposed in the thermal management portion, that thermally manages the first portion.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2 shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a second data processing device in accordance with one or more embodiments of the invention.

FIG. 2.2 shows a first cross section diagram of the data processing device of FIG. 2.1 in accordance with one or more embodiments of the invention.

FIG. 2.3 shows a second cross section diagram of the data processing device of FIG. 2.1 in accordance with one or more embodiments of the invention.

FIG. 2.4 shows a third cross section diagram of the data processing device of FIG. 2.1 in accordance with one or more embodiments of the invention.

FIG. 2.5 shows a fourth cross section diagram of the data processing device of FIG. 2.1 in accordance with one or more embodiments of the invention.

FIG. 2.6 shows a fifth cross section diagram of the data processing device of FIG. 2.1 in accordance with one or more embodiments of the invention.

DETAILED DESCRIPTION

Figure 3:
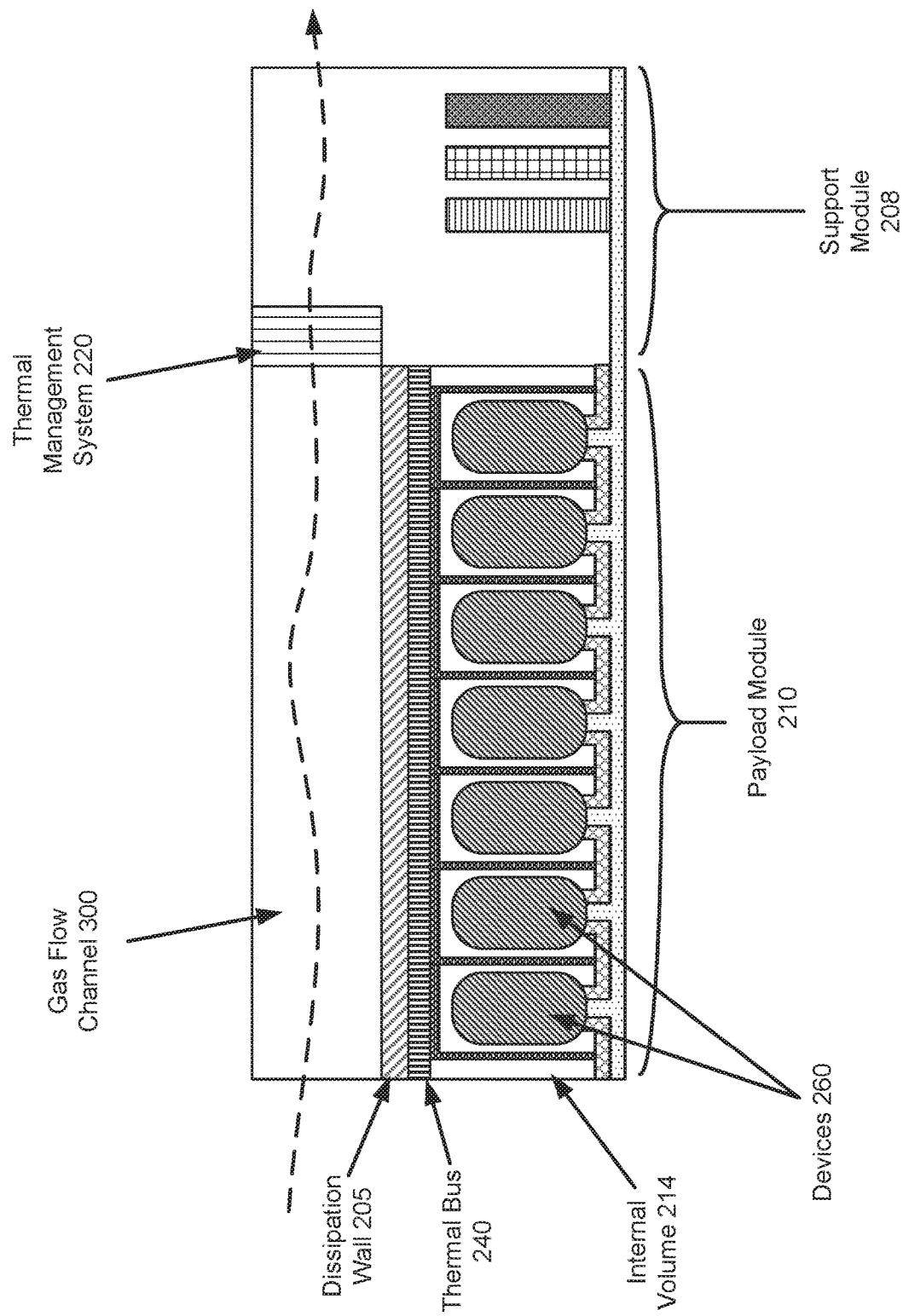
FIG. 3 shows a sixth cross section diagram of the data processing device of FIG. 2.1 in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing thermal energy and electromagnetic interference in a high-density environment. Specifically, embodiments of the invention may provide a system that manages thermal energy and electromagnetic interference at a device level (e.g., the devices that generate the thermal energy and electromagnetic interference). By doing so, embodiments of the invention may facilitate the inclusion of devices in a high-density environment while mitigating the impact of electromagnetic interference and thermal energy generated by the devices.

In one or more embodiments of the invention, a data processing device includes electromagnetic interference isolators. The electromagnetic interference isolators may provide electromagnetic isolation services to corresponding devices disposed in the electromagnetic interference isolators.

In one or more embodiments of the invention, the data processing device includes a thermal bus that is thermally coupled to the devices disposed in the electromagnetic interference isolators. The thermal bus may, predominantly through conduction, extract thermal energy from the devices to facilitate transport of the thermal energy away from the devices. By doing so, the thermal state of the devices may be managed while being electromagnetically isolated. Consequently, such devices may be integrated into a high density computing environment without negatively impacting the electromagnetic or thermal state of the high density computing environment.

FIG. 1.1 shows an example system in accordance with one or more embodiments of the invention. The system may include a frame (100) and any number of data processing devices (102). The components of the example system may provide electromagnetic interference management services for devices disposed within the data processing devices (102). By doing so, devices that emit electromagnetic interference may be utilized in a high-density computing environment without negatively impacting the high-density computing environment.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space.

To do so, the system of FIG. 1.1 may reduce the strength of the electromagnetic interference when propagating from inside of a portion of the data processing devices (102) to an ambient environment (or other portions of the data processing devices (102)) around the data processing devices (102) and/or other locations by at least 90 decibels. For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The electromagnetic interference isolation provided by the data processing devices (102) may have a frequency dependent response. For example, the data processing devices (102) may provide at least 90 decibels (dB), or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communications capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

The components of the example system may also provide thermal management services for devices disposed within the data processing devices (102). Thermal management services may include removing thermal energy from the devices. By doing so, devices disposed within the data processing devices (102) that generate thermal energy may operate while all, or a portion, of the generated thermal is removed for thermal management purposes.

In one or more embodiments of the invention, the example system provides thermal management services on a per device level. That is, the example system may include one or more mechanisms for removing thermal energy from each of the devices rather than on an aggregate, device group level.

To further discuss aspects of embodiments of the disclosed technology, each component of the system of FIG. 1.1 is discussed below.

In one or more embodiments of the invention; the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For additional details regarding computing devices, refer to FIG. 4.

A chassis may be a mechanical device that is adapted to (i) facilitate attachment of the data processing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices (and/or other devices such as electromagnetic interference emitting devices) within a data processing device.

To house the one or more electromagnetic interference emitting devices, the chassis may include one or more internal volumes. The internal volumes may have a shape or other characteristic(s) that facilitates disposing of the one or more electromagnetic interference emitting devices within the data processing device. For example, an internal volume of the chassis may be a rectangular void capable of housing one or more electromagnetic interference emitting devices.

In one or more embodiments of the invention, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely/partially attenuated when leaving an internal volume) from propagating from within the data processing devices (102) into the ambient environment (or other portions of the data processing devices) surrounding the respective data processing devices (102).

In another example, one or more portions of the chassis that bound the one or more internal regions may be formed in a manner that filters (e.g., reflects/attenuates radiation of a certain frequency while allowing radiation of other frequencies to propagate) electromagnetic radiation when electromagnetic radiation passes through the portions of the chassis. For example, a portion of the chassis that bounds the one or more internal regions may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

In a further example, one or more portions of the chassis that bound the one or more internal regions may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other electromagnetically lossy material. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

To provide thermal management services to the computing devices and/or the electromagnetic interference emitting devices, the data processing devices (102) extract thermal energy from the devices disposed within the data processing devices (102). The data processing devices (102) may extract the thermal energy through any thermal transport method (e.g., conduction, convection, radiation). Once thermal energy is extracted from a device, the thermal energy may be expelled into a portion of the environment surrounding a data processing device.

For example, the data processing devices (102) may extract thermal energy from the devices by disposing heat sinks and/or thermal buses onto (direct or indirect) the devices. The thermal energy may be extracted primarily via conduction of the thermal energy into the heatsinks and/or thermal buses. The extracted thermal energy may traverse the thermal buses to another portion of the data processing devices (102) adapted to expel the thermal energy from the data processing devices (102).

In another example, a data processing device may include one or more vents that enable gas from a first side of a data processing device to flow into the data processing device, through the data processing device, and out of a second side of the data processing device. The gas, flowing through the data processing device, may be at a different temperature than the one or more devices disposed within the data processing device. A heatsink, thermal bus, or other thermal transport component may be disposed on a device which enables thermal energy to be extracted from the device and expelled into the gas flow. The gas may be air or another type/combination of gasses obtained from any source.

A system in accordance with embodiments of the invention may include any number of data processing devices, electromagnetic interference emitting devices, and/or other types of devices. Different data processing devices (102) may have different configurations and/or uses within the system.

For example, some data processing devices may be adapted to house many electromagnetic interference emitting devices while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices and/or other types of devices. The system of FIG. 1.1 may further include a third data processing device (108). In contrast to the first data processing device (104) and the second data processing device (106), the internal structure of the third data processing device (108) may be adapted to only housing computing devices rather than electromagnetic interference generating devices.

For additional details regarding data processing devices, refer to FIGS. 2.1-2.5.

As discussed above, data processing devices (102) may house electromagnetic interference emitting devices. When so housed, the electromagnetic interference emitting devices may operate thereby generating electromagnetic interference (e.g., electromagnetic radiation). At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the internal volumes of the data processing devices (102).

While the system of FIG. 1.1 has been illustrated as including a limited number of components, a system in accordance with embodiments of the invention may include any number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices (and/or other types of devices) may be removed from and/or added to the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration (i.e., after a reconfiguration from the configuration illustrated in FIG. 1.1) where a top door (112) of the second data processing device (106) has been opened after translating the second data processing device (106) with respect to the frame. The top door (112) may be all, or a portion, of the chassis that may be reversibly moved to enable access to internal volumes of the first data processing device (104).

Open the top door (112), for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management and/or thermal management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-2.6 show diagrams of data processing devices in accordance with embodiments of the invention.

FIG. 2.1 shows a diagram of the second data processing device (106) in accordance with one or more embodiments of the invention. As discussed above, the second data processing device (106) may provide electromagnetic interference management and/or thermal management services for electromagnetic interference emitting devices (and/or other types of devices) disposed within the second data processing device (106). In addition to electromagnetic interference management and/or thermal management services, the second data processing device (106) may provide power management services and communications services. The aforementioned services may be provided to electromagnetic interference emitting devices and/or computing devices and/or other types of devices disposed within the second data processing device (106).

To do so, the second data processing device (106) may include a chassis (198). The chassis (198) may be a structure that is mountable to a frame. By being mountable to a frame, the chassis (198) may be usable in a high density environment. For example, the chassis (198) may be a rail mount chassis. The chassis (198) may be mountable via other methods (e.g., using mechanical features other than rails such as bolts, screws, pins, etc.).

The chassis (198) may include a front vent (200), a rear vent (204), a support module (208), and a payload module (210). In some embodiments of the invention, the chassis (198) may not include any vents proximate to the payload module (210). For example, as will be discussed in greater detail below, the payload module (210) may be completely sealable electromagnetically and/or hydraulically (e.g., gas flows) from other portions of the second data processing device and/or an ambient environment proximate to the second data processing device. Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200).

In one or more embodiments of the invention, the front vent (200) reflects and/or attenuates electromagnetic radiation that is propagating from the internal volume (214) to an ambient environment through the front vent (200) by at least 90 decibels (or another suitable level such as, for example, 30 decibels, 45 decibels, 60 decibels, 75 decibels, etc.). By doing so, the front vent (200) may delineate one of the walls of the internal volume (214) to enable the internal volume (214) to be electromagnetically suppressed and/or isolated by 90 decibels (or another suitable level of suppression/isolation) from the ambient environment and/or other portions of the chassis (e.g., the support module (208)).

In one or more embodiments of the invention, the front vent (200) is a rectangular structure formed with holes (202) that enable gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause the cool gas to flow into the second data processing device (106) via the front vent (200) and exhaust gas out a second side of the second data processing device (106) (e.g., out of the support module (208)). Alternatively, the second data processing device (106) may cause a reverse gas flow, with respect to the gas flow discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels or another desirable quantity (e.g., 30 decibels, 45 decibels, 60 decibels, 75 decibels, 120 decibels, etc.).

To facilitate the flow of gas between the ambient environment and the internal volume of the second data processing device (106), the size, position, number, shape, and/or other characteristics of the holes (202) may be selected to meet gas flow requirements for thermal management purposes while providing electromagnetic interference suppression characteristics.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention.

While the vents (e.g., 200, 204) have been described as facilitating gas flow through an internal volume of the second data processing device (106), the vents may facilitate the flow of gas through other portions of the second data processing device without departing from the invention. For example, the vents may be used to facilitate gas flows through channels or other structures proximate to, but separate from, the payload module (210) in which an internal volume may be disposed. The channels and internal volume may be separated by a wall that facilitates thermal exchange between the internal volume (and/or components disposed in the internal volume) and the gas flow. For additional details regarding such an implementation, refer to FIG. 3.

The payload module (210) may be a physical device for (i) housing electromagnetic interference devices (and/or other types of devices), (ii) limiting propagation of electromagnetic interference from internal volumes of the second data processing device (106) to the ambient environment surrounding the second data processing device (106), and (iii) thermally managing devices disposed within the payload module (210). For additional details regarding the payload module (210), refer to FIGS. 2.2-2.6.

The support module (208) may be a physical device for housing devices that provide services to devices disposed within the payload module (210). For example, the support module (208) may house one or more power supplies (e.g., a power system), fans (e.g., a thermal management system), networking devices (e.g., a communication system), and/or computing devices. The aforementioned devices may provide corresponding services to devices disposed in other portions of the second data processing device (106) and/or devices located in other locations (i.e., external to the second data processing device (106)).

In one or more embodiments of the invention, the support module (208) does not provide electromagnetic interference management services to devices disposed within the support module (208), in contrast to the payload module (210). For example, the support module (208) may not intentionally isolate electromagnetic interference generated by devices disposed within the support module (208) from the ambient environment surrounding the second data processing device (106). Intentionally isolating electromagnetic interference means that the structure of a physical structure is adapted to provide such isolation. While many types of physical structures may provide some degree of electromagnetic interference isolation as an inherent consequence of their existence, the electromagnetic interference isolation is not intended. Rather, the physical structures may exist for their other properties such as mechanical strength while providing some degree (albeit low) of electromagnetic interference isolation. Thus, while the support module (208) may to some degree electromagnetically separate devices disposed within the support module (208) from the ambient environment, the support module (208) does not provide electromagnetic interference management services. Providing electromagnetic interference management services may refer to providing at least 20 decibels of attenuation.

In one or more embodiments of the invention, providing electromagnetic interference management services means reducing the strength of electromagnetic radiation by at least 20 decibels when the electromagnetic radiation propagates from an internal volume of a data processing device to an ambient environment outside of the data processing device.

The one or more power supplies may supply power to other devices. For example, the power supplies may provide power to electromagnetic interference emitting devices disposed within the payload module (210), other types of devices (e.g., computing device) disposed within the payload module, and/or devices disposed in other areas (of the second data processing device and/or remote areas).

The one or more power fans may provide thermal management services to other devices. For example, the fans may regulate the flow of gasses through the second data processing device and, consequently, manage the thermal state of electromagnetic interference emitting devices and/or other types of devices disposed in the payload module (210) and/or the support module (208). For additional details regarding providing thermal management services, refer to FIG. 2.2.

The one or more power networking devices may provide communication services to other devices (e.g., providing network services). For example, the networking devices may manage network interfaces that enable the second data processing device (106) (and/or devices disposed within the second data processing device (106)) to communicate with other devices (e.g., computing devices that may be controlling the operation of the electromagnetic interference emitting devices).

The one or more computing devices may manage the operations of the other entities of the second data processing device (106). For example, the computing devices may send messages to the electromagnetic interference emitting devices to perform predetermined functionality. Such messages, when received by the electromagnetic interference emitting devices may cause the electromagnetic interference emitting devices to stop and/or start emitting electromagnetic interference (and/or perform other actions).

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module, on the vents, or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

To further clarify aspects of embodiments of the invention, a cross section diagram of the second data processing device (106) in accordance with one or more embodiments of the invention is shown in FIG. 2.2. In FIG. 2.2, the cross section is taken along the X-Y plane illustrated in FIG. 2.1.

As seen from FIG. 2.2, the payload module (210) may include an internal volume (214). The internal volume (214) may be used to house devices such as electromagnetic interference emitting devices, supports for such devices, and/or other devices that may provide services to the electromagnetic interference emitting devices and/or other devices.

The internal volume (214) may be bounded, on six sides, by portions of the payload module (210). For example, the internal volume (214) may be bounded by a top door (212), a bottom (218), a first side (216), a second side (not shown), a dissipation wall (205), and a front wall (215). These six portions of the payload module (210) may define a rectangular shape of the internal volume (214). The internal volume (214) may have other shapes without departing from the invention.

The dissipation wall (205) may be a physical structure adapted to facilitate dissipation of thermal energy from the internal volume (214). For example, the dissipation wall (205) may be a sheet of thermally conductive material, such as brass or aluminum, that facilitates transmission of thermal energy out of the internal volume (214). In one or more embodiments of the invention, the dissipation wall (205) may be a fluid driven heat sink. That is, cooled fluids may be pumped through the dissipation wall (205) to improve the rate of thermal transport from devices disposed within the internal volume (214) to the dissipation wall. In such a scenario, the dissipation wall (205) may be hydraulically connected to a heat exchanger (not shown) disposed in the support module (208) or at another location.

While illustrated in FIG. 2.2 as being a single wall, the dissipation wall (205) may extend to any number of walls that bound the internal volume (214) without departing from the invention. Further, while illustrated as encompassing all of a side of a rectangular volume, the dissipation wall (205) may only encompass a portion of a wall (e.g., half of a wall) without departing from the invention. Additionally, while the dissipation wall (205) is illustrated in FIG. 2.2 as separating the payload module (210) from the support module (208), the dissipation wall (205) may be disposed on other walls that bound a portion of the internal volume (214) without departing from the invention.

As discussed above, the second data processing device may provide thermal management services to devices disposed within the second data processing device. To do so, the second data processing device may include a thermal management system (220).

The thermal management system (220) may dissipate thermal energy from devices disposed within the internal volume (214). By doing so, the thermal state of the devices may be managed (e.g., maintained within a predetermined temperature range). To do so, the thermal management system (220) may (i) obtain thermal energy from the devices, (ii) exchange the thermal energy with a gas flow to heat the gas flow, and/or (iii) exhaust the heated gas flow from the second data processing device.

The thermal management system (220) may obtain the thermal energy from the devices via any method without departing from the invention. To obtain the thermal energy, the thermal management system (220) may utilize heat transfer mechanisms such as conduction, convection, and/or radiation. For example, the thermal management system (220) may include thermal buses between the devices and the thermal management system (220) that facilitates transport thermal energy from the devices to the thermal management system (220). For additional details regarding thermal buses, refer to FIG. 2.3.

The thermal management system (220) may exchange the thermal energy with the gas flow via any method without departing from the invention. For example, the thermal management system (220) may include thermal exchangers that are disposed proximate to the gas flow. Consequently, thermal energy obtained by the thermal management system (220) may be exchanged with the gas flow.

The thermal management system (220) may exhaust the heated gas flow from the second data processing device via any method without departing from the invention. For example, the thermal management system (220) may include gas flow controllers such as fans that direct the heated gas flow out of the second data processing device.

To manage the aforementioned process, the thermal management system (220) may include a controller that may operate the flow control devices and/or other components of the thermal management system (220) based on temperature information obtained from the temperature sensors and/or temperature information obtained from other devices (e.g., from electromagnetic interference emitting devices). For example, the controller may increase the flow rate of a gas flow adjacent to thermal exchanges to manage the thermal state of one or more devices within a predetermined range.

The second data processing device may also include a power system (222). The power system may provide power to any number and/or types of devices disposed within the second data processing device. For example, the power system (222) may provide power to electromagnetic interference emitting devices disposed within the payload module (210), the thermal management system (220), a communication system (224), and/or computing devices (e.g., 226).

To do so, the power system (222) may include, for example, one or more power supplies, regulators, controllers, and/or other types of components for providing power. The aforementioned components may identify components to which power is to be supplied, identify a quantity of power to supply to each of the components, and/or provide the power to each of the respective components. As will be discussed in greater detail below, the power system (222) may provide power using an interconnect (230).

The second data processing device may further include a communication system (224). The communication system may provide communication services to any number of devices of the second data processing device.

To do so, the communication system (224) may include, for example, one or more transceivers, communication processors, and/or other types of components for providing communication services. The aforementioned components may provide the communication services. The communication services may include, for example, exchanging network data units with electromagnetic interference emitting devices disposed in the payload module, a computing device (226) disposed in the support module (208), and/or other devices disposed outside of the second data processing device. By doing so, the aforementioned devices may communicate with one another via information included in the exchanged network data units even when electromagnetically isolated by being disposed within the internal volume. A network data unit may be a communication supported by a communication protocol that enables information to be transmitted. A network data unit may be, for example, a packet in the vent that an internet protocol is utilized. As will be discussed in greater detail below, the communication system (224) may provide the communication services using the interconnect (230).

The computing device (226) may manage the operation of the components of the second data processing device. For example, the computing device (226) may manage the thermal management system (220), the power system (222), the communication system (224), and/or other components (such as electromagnetic interference emitting devices or other types of devices) disposed within the second data processing device. To manage the other devices, the computing device (226) may use the communication services provided by the communication system (224) as well as the interconnect (230).

The interconnect (230) may be a physical device for providing operable connections between devices disposed within the second data processing device. The interconnect (230) may support distribution of power by the power system (222) to any number of devices disposed within the payload module (210), the support module (208), and/or other locations.

For example, the interconnect (230) may include a set of wires that physically interconnects devices disposed within the second data processing device.

In one or more embodiments of the invention, the interconnect (230) facilitates distribution of power to electromagnetic interference emitting devices disposed within the payload module (210) while the electromagnetic interference emitting devices are isolated. By doing so, the electromagnetic interference emitting devices may be provided power without negatively impacting the operation of other devices due to electromagnetic interference generated by the electromagnetic interference emitting devices.

To do so, the second data processing device may include a backplane (232). The back-plane may electromagnetically isolate the interconnect (230) from the internal volume of the payload module (210). For example, the backplane (232) may be a metal sheet of sufficient thickness to prevent electromagnetic interference from penetrating through the backplane (232).

The backplane (232) may include any number of feedthroughs (234). The feedthroughs (234) may be physical devices that enable the interconnect (230) to physically connect to any number of devices disposed within the payload module (210).

The interconnect (230) may also facilitate communications between devices disposed in the internal volume (214) and other devices while the devices disposed in the internal volume are electromagnetically isolated while disposed in the internal volume. For example, the interconnect (230) may include transmission lines (e.g., coaxial lines, twisted pairs, etc.) that support high speed communications. Such transmission lines may interconnect the devices disposed in the internal volume (214) and the communication system (224) disposed in the support module (208). Thus, while electromagnetically isolated, the devices disposed in the internal volume (214) may be operably connected to the communication system (224) via physical connections and, in turn, operably connected to any number of other devices via operable connections (wired/wireless) between the communication system (224) and the other devices.

While the second data processing device has been illustrated as including a limited number of specific components in a specific arrangement, a data processing device in accordance with embodiments of the invention may include fewer, additional, and/or different components disposed in a similar or different arrangement without departing from the invention. For example, FIG. 3 shows another diagram of a data processing device in accordance with embodiments of the invention that has a substantially different arrangement than that illustrated in FIG. 2.2.

To further clarify the operation of the second data processing device, FIG. 2.3 shows a second cross section diagram, similar to that of FIG. 2.2, but including a thermal bus (240), an electromagnetic interference isolator (242), and a device (246).

The thermal bus (240) may be a physical structure adapted to facilitate transmission of thermal energy to a dissipation wall (205). The thermal bus (240) may be formed from a thermally conductive material such as brass, aluminum, or another thermal conductor. The thermal bus (240) may have any shape. The shape of the thermal bus (240) may be adapted to facilitate the transmission of the thermal energy. The thermal energy may be generated by one or more devices disposed in the internal volume (214).

The electromagnetic interference isolator (242) may be a physical device for subdividing the internal volume (214) into any number of portions (e.g., 244) and a thermal management portion (245). Each of the portions of the internal volume may be electromagnetically isolated from one another by the electromagnetic interference isolator (242). Similarly, each of the portions of the internal volume may be electromagnetically isolated from the thermal management portion (245). For example, while the internal volume (214) is illustrated as including a single electromagnetic interference isolator (242), the internal volume (214) may include multiple electromagnetic interference isolators which subdivide the internal volume (214) into a corresponding number of portions, within each of the electromagnetic interference isolators, and the thermal management portion (245). The portion of the internal volume (244) may be adapted to house devices (e.g., 246) while the thermal management portion (245) may be adapted to house other components such as a thermal bus (240) that may not benefit from electromagnetic interference isolation provided by the electromagnetic interference isolators (242).

In one or more embodiments of the invention, the electromagnetic interference isolator (242) is a Faraday cage. For example, electromagnetic interference isolator (242) may be a plastic bag (or other suitable material) that is metallized. The metallization disposed on the plastic bag may form the Faraday cage that prevents electromagnetic radiation from propagating outside of each of the portions of the internal volume (e.g., 244).

In one or more embodiments of the invention, the electromagnetic interference isolator (242) is adapted to be attached to one of the walls of the internal volume or another structure that may complete the formation of a Faraday cage. For example, electromagnetic interference isolator (242) may be adapted to attach to the backplane (232, FIG. 2.2).

The electromagnetic interference isolator (242) may be adapted to attach to one of the walls of the internal volume or another structure and may be any mechanism without departing from the invention. For example, electromagnetic interference isolator (242) may include snaps, bolts, pins, zippers, or any other type of physical interconnection mechanism. The aforementioned physical interconnection mechanisms may be adapted to reversibly attach the electromagnetic interference isolator (242) to other components of the second data processing device.

As seen from FIG. 2.3, and the device (246) is disposed in the portion of the internal volume (244), the device (246) may physically connect to the interconnect (230, FIG. 2.2). By physically connecting to the interconnect, the device (246) may receive power and/or may communicate with the communication system (224) via the interconnect.

To further clarify aspects of embodiments of the disclosed technology, a third cross-section view of the second data processing device in accordance with one or more embodiments of the invention is shown in FIG. 2.4. FIG. 2.4 shows an expanded view of FIG. 2.3 near the device (246).

As seen from FIG. 2.4, when the device (246) is disposed within the electromagnetic interference isolator (242), the device (246) may be physically isolated within the internal volume. When operating, the device (246) may generate thermal energy. To provide thermal management services to the device (246), the electromagnetic interference isolator (242) may be thermally coupled to the device (246), the thermal bus (240), and/or a thermal sink (248). By being thermally coupled, thermal energy generated by the device (246) may be transported to the thermal bus (240). Consequently, the device (246) may be thermally managed by dissipating the thermal energy generated by the device (246) via the thermal bus (240).

To facilitate transport of thermal energy generated by the device (246) into the thermal bus (240), the second data processing device may include the thermal sink (248). In one or more embodiments of the invention, the thermal sink (248) is a physical device for facilitating thermal transport between the device (246) and the thermal bus (240). For example, the thermal sink (248) may be a heatsink disposed on the electromagnetic interference isolator (242).

The thermal sink (248) may be, for example, a thermal conductor such as a metal or another thermally conductive material. The thermal sink (248) may be an active thermal transport device without departing from the invention. For example, the thermal sink (248) may be a Peltier cooler that is a cool side disposed on electromagnetic interference isolator (242) and a hot side disposed on the thermal bus (240).

The thermal sink (248) may have a shape that is complementary to a shape of the device (246) such that the device (246) may be disposed directly on the electromagnetic interference isolator (242) which is, in turn, directly disposed on the thermal sink (248). For example, the thermal sink (248) may have a shape that is adapted to cradle a portion of the device (246).

Thus, the thermal sink (248) may facilitate and/or enhance transport of thermal energy from the device (246) into the thermal bus (240).

As noted above, when thermal energy is disposed in the thermal bus (240), the thermal bus (240) may facilitate dissipation of the thermal energy. For example, the thermal bus (240) may be a thermally conductive material that facilitates thermal transport of thermal energy to a dissipation wall.

The thermal bus (240) may be, for example, a thermal conductor such as a metal or another thermally conductive material. The thermal bus (240) may be an active thermal transport device without departing from the invention. For example, the thermal bus (240) may be a liquid cooling system that recirculates liquid throughout the thermal bus (240) to facilitate thermal transport of thermal energy away from the device (246).

In some embodiments of the invention, the thermal bus (240) may include separate liquid lines associated with different electromagnetic interference isolators. To modify a rate of thermal transport of thermal energy away from devices disposed in each of the respective electromagnetic interference isolators, the flow of liquid corresponding in liquid lines associated with corresponding electromagnetic interference isolators may be modified. Thus, the rate of thermal transport of thermal energy for the devices disposed in the internal volume may be managed on a granular (e.g., per device level) or macro (e.g., for all of the devices) level.

In one or more embodiments of the invention, the device (246) is an electromagnetic interference emitting device. All, or a portion, of the electromagnetic interference emitted by the device (246) may correspond to a wireless communication scheme employed by the device (246). In some embodiments of the invention, it may be preferred that the device (246) communicate, at least in part, using the wireless communication scheme.

FIG. 2.5 shows a fourth cross-section view of the second data processing device in accordance with one or more embodiments of the invention. FIG. 2.5 shows a cross section similar to that of FIG. 2.4 but includes a wireless system (256) and multiple connectors (e.g., 252, 254).

The connectors (252, 254) may operably connect the device (246) and the wireless system (256) to the interconnect (230). In turn, the interconnect (230) may operably connect the device (246) and the wireless system (256) to other components such as a power system communication system, as discussed above.

The wireless system (256) may be a physical device for facilitating the use of the wireless communication scheme employed by the device (246). In one or more embodiments of the invention, the wireless system (256) includes a wireless transceiver and antenna adapted to facilitate communications between the device (246) and a communication system. By doing so, the device (246) may utilize its wireless communication scheme to operably connect to any number of other devices via the wireless system (256) and/or the communication system.

Thus, as illustrated in FIG. 2.5, a device (246) disposed within the electromagnetic interference isolator (242) may be able to communicate with other devices using its wireless communication scheme while being electromagnetically isolated from the other devices with which the device (246) communicates.

To further clarify aspects of embodiments of the invention, a fifth cross-section diagram in accordance with one or more embodiments of the invention is shown in FIG. 2.6. The fifth cross section diagram may be similar to that illustrated in FIG. 2.3 but includes multiple portions of the internal volume (262) delineated by corresponding electromagnetic interference isolators. Devices (260) may be disposed within each of the multiple portions of the internal volume (262).

Each of the devices (260) may be thermally coupled to the thermal bus (240). Similarly, each of the devices (260) may be operably connected to the communication system (224). Thus, as illustrated in FIG. 2.6, a data processing device in accordance with embodiments of the invention may include an internal volume (214) that is subdivided into any number of portions of the internal volume (262) that are electromagnetically isolated from each other. While the devices (260) are disposed in the portions of the internal volume (262), the devices (260) may be operably connected to each other and the communication system (224) while being electromagnetically isolated from each other.

Additionally, each of the devices (260) may be thermally coupled to the thermal bus (240). By being thermally coupled to the thermal bus (240) thermal energy generated by the devices (260) may be transported away from the devices (260) via the thermal bus (240). For example, the thermal bus (240) may transport the thermal energy generated by the devices (260) to a dissipation wall (205).

The dissipation wall (205) may be thermally coupled to a thermal management system (220). The thermal management system may dissipate thermal energy obtained from the dissipation wall (205). For example, the thermal management system (220) may use a gas flow as illustrated by the arrow with a dashed tail to transport the thermal energy obtained from the dissipation wall (205) into an ambient environment surrounding the second data processing device. Specifically, cool gas may be pulled into the support module (208), across heat exchangers of the thermal management system (220), and out of the support module (208).

However, a data processing device in accordance with embodiments of the invention may be arranged in a different manner to provide similar functionality. FIG. 3 shows a six cross-section diagram in accordance with one or more embodiments of the invention. In the sixth cross-section diagram, the arrangement of the internal configuration of the second data processing device may be different from that illustrated in FIG. 2.6.

As seen from FIG. 2.6, a gas flow channel (300) is made to be disposed adjacent to the dissipation wall (205) that defines a top wall of the internal volume (214). The thermal bus (240) may be disposed between the dissipation wall (205) and electromagnetic interference isolators that subdivide the internal volume (214) into different portions for housing devices (260).

The gas flow channel (300) may facilitate a gas flow as illustrated by the arrow having a dashed tail. The rate of the flow of the gas flow may be controlled by the thermal management system (220). Consequently, the rate of dissipation of thermal energy from the dissipation wall (205) may be controlled by the thermal management system (220) by modulating the rate of the gas flow.

The gas flow facilitated by the gas flow channel (300) may be directed into the second data processing device from a first side of the data processing device, through the gas flow channel (300), through the support module (208), and out of a second side of the data processing device proximate to the support module (208). The aforementioned gas flow may be compatible with many high-density computing environments that utilize gas intake on a first side of data processing devices and gas exhaust on a second side of the data processing devices.

Figure 4:
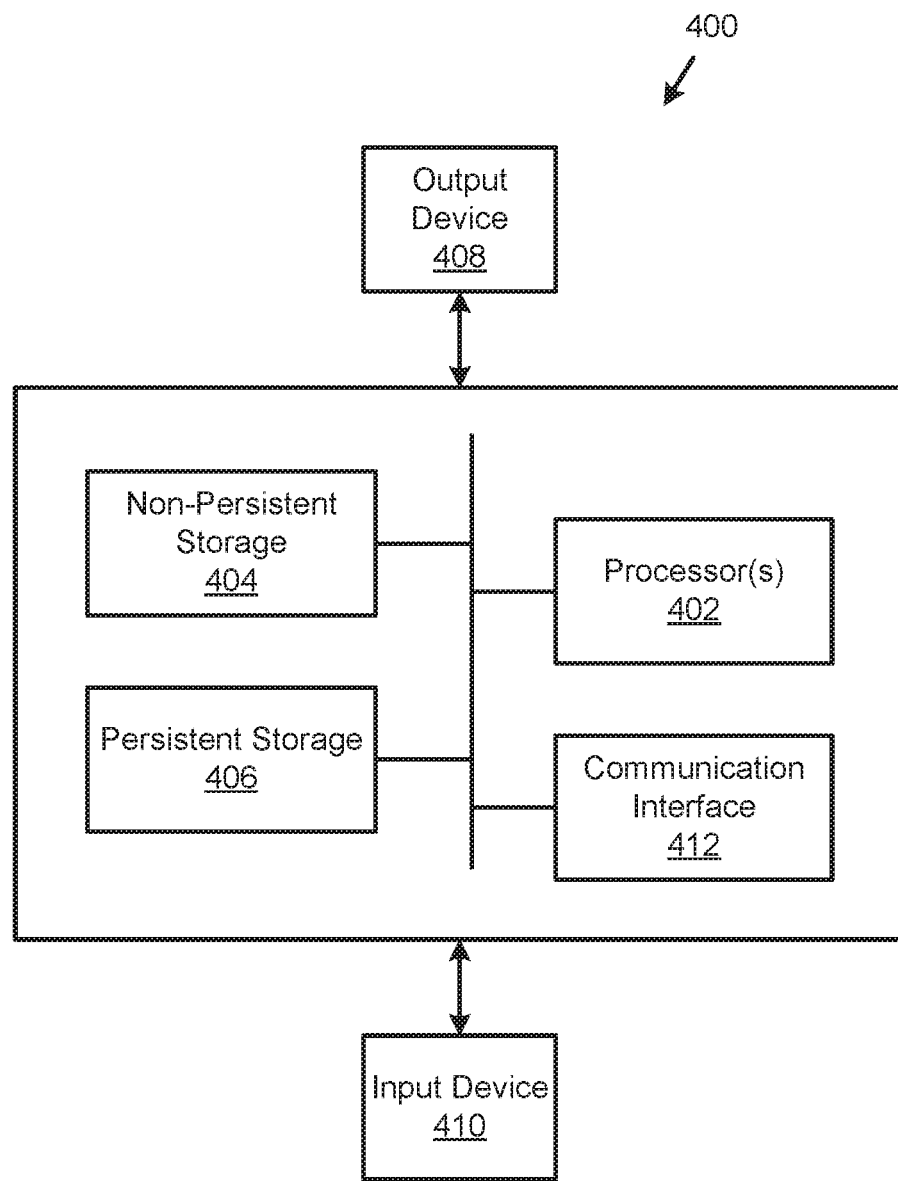
FIG. 4 shows a diagram of a computing device in accordance with one or more embodiments of the invention.

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide a method, system, and device for managing electromagnetic interference and thermal energy. A system in accordance with embodiments of the invention may manage electromagnetic interference at a device level. That is, each device may be electromagnetically isolated from other devices and an ambient environment surrounding the devices. By doing so, such data processing devices that house any number of devices may be used in a high-density environment without negatively impacting the functionality of the high-density environment due to electromagnetic interference.

Additionally, embodiments of the invention may provide a method for managing the generation of thermal energy by devices that also emit electromagnetic interference. Specifically, embodiments of the invention may provide a method for extracting thermal energy from devices while maintaining electromagnetic isolation of the devices. By doing so, such devices may be utilized in a high density environment without negatively impacting the operation of the devices due to thermal energy buildup (and potential thermal failure due to the thermal energy buildup).

Thus, embodiments of the invention may address the problem of management of electromagnetic interference within a high-density environment. Specifically, embodiments of the invention may provide a solution that facilitates granular electromagnetic isolation of devices within a high-density environment while also facilitating extraction of thermal energy from the devices.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A data processing device, comprising:
   an internal volume divided into isolated portions and a thermal management portion,
   wherein the isolated portions are electromagnetically isolated from the thermal management portion by at least 90 decibels;
   an isolator adapted to electromagnetically isolate a first isolated portion of the isolated portions from a second isolated portion of the isolated portions; and
   a thermal bus, disposed in the thermal management portion, adapted to thermally manage the first isolated portion.

2. The data processing device of claim 1, wherein the thermal bus is further adapted to thermally manage all of the isolated portions.

3. The data processing device of claim 1, wherein the thermal bus is adapted to thermally manage the first isolated portion by extracting thermal energy from the first isolated portion into the thermal management portion.

4. The data processing device of claim 3, wherein the thermal bus is disposed on the first isolated portion, wherein the thermal bus extracts thermal energy from the first isolated portion through conduction.

5. The data processing device of claim 3, wherein the thermal bus is further adapted to extract the thermal energy from the thermal management portion.

6. The data processing device of claim 1, wherein the thermal management portion is electromagnetically isolated from an ambient environment surrounding the data processing device by at least 90 decibels.

7. The data processing device of claim 1, further comprising:
   a dissipation wall adapted to receive thermal energy from the thermal bus; and
   a thermal management system adapted to dissipate heat from the dissipation wall into an ambient environment surrounding the data processing device.

8. The data processing device of claim 1, wherein the isolator comprises:
   a metallized bag adapted to attach to a wall delineating the internal volume.

9. The data processing device of claim 8, further comprising:
   a connector that traverses the wall for providing power to a device disposed within the first isolated portion.

10. The data processing device of claim 9, wherein the connector comprises an electromagnetic interference filter adapted to reduce a strength of electromagnetic interference generated by the device disposed in the first isolated portion as the electromagnetic interference propagates through the connector.

11. The data processing device of claim 8, further comprising:
    a wireless system, disposed in the first isolated portion, adapted to operably connect to a device disposed in the first isolated portion using a wireless channel.

12. The data processing device of claim 11, wherein the wireless system comprises an antenna.

13. The data processing device of claim 1, further comprising:
a thermal sink, disposed in the thermal management portion, adapted to thermally connect to a device disposed in the first isolated portion.

14. The data processing device of claim 13, wherein the thermal sink is adapted to extract thermal energy from the first isolated portion.

15. The data processing device of claim 14, wherein the thermal sink is further adapted to transmit the thermal energy to the thermal bus.

16. The data processing device of claim 1, wherein the first isolated portion is electromagnetically isolated from the second isolated portion by at least 90 decibels.

17. The data processing device of claim 1, wherein the internal volume is sealed from an ambient environment surrounding the data processing device.

18. The data processing device of claim 1, wherein none of the isolated portions are adapted to be cooled using convection.

19. The data processing device of claim 1, wherein all of the isolated portions are adapted to be cooled using conduction.

20. A data processing device, comprising:
an internal volume divided into isolated portions and a thermal management portion;
an isolator adapted to electromagnetically isolate a first isolated portion of the isolated portions from a second isolated portion of the isolated portions,
wherein the isolator comprises a metallized bag adapted to attach to a wall delineating the internal volume; and
a thermal bus, disposed in the thermal management portion, adapted to thermally manage the first isolated portion.

* * * * *